US010732655B2

(12) United States Patent
Yoshida et al.

(10) Patent No.: US 10,732,655 B2
(45) Date of Patent: Aug. 4, 2020

(54) ENERGY HARVESTING APPARATUS AND CURRENT CONTROL CIRCUIT (71) Applicant: ZEON CORPORATION, Chiyoda-ku, Tokyo (JP)

(72) Inventors: Masayoshi Yoshida, Tokyo (JP); Kiyoshige Kojima, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 113 days.

(21) Appl. No.: 16/302,763

(22) PCT Filed: May 29, 2017

(86) PCT No.: PCT/JP2017/019958
§ 371 (c)(1),
(2) Date: Nov. 19, 2018

(87) PCT Pub. No.: WO2017/209067
PCT Pub. Date: Dec. 7, 2017

(65) Prior Publication Data
US 2019/0129455 A1 May 2, 2019

(30) Foreign Application Priority Data
Jun. 2, 2016 (JP) ................................. 2016-110992

(51) Int. Cl.
G05F 1/56 (2006.01)
H01L 31/05 (2014.01)
(52) U.S. Cl.
CPC ................. G05F 1/56 (2013.01); H01L 31/05 (2013.01)

(58) Field of Classification Search
CPC .................................. G05F 1/56; H01L 31/05
USPC ............................................................. 307/78
See application file for complete search history.

(56) References Cited

U.S. PATENT DOCUMENTS 5,362,942 A * 11/1994 Vanderslice, Jr. ........ H02J 7/00
219/209
5,757,172 A * 5/1998 Hunsdorf ................ G05F 1/567
323/277
7,221,129 B2 * 5/2007 Matsuo ................. H02M 3/158
323/222

(Continued)

FOREIGN PATENT DOCUMENTS

JP 2009017686 A 1/2009

OTHER PUBLICATIONS

Dec. 13, 2019, Invitation pursuant to Rule 62a(1) EPC issued by the European Patent Office in the corresponding European Patent Application No. 17806622.1.

(Continued)

Primary Examiner — Alfonso Perez Borroto
(74) Attorney, Agent, or Firm — Kenja IP Law PC (57) ABSTRACT Disclosed are an energy harvesting apparatus and a current control circuit which include: a current control unit; a first voltage control unit that controls the current control unit so that an input voltage to the current control unit becomes equal to or higher than a first voltage; and a second voltage control unit that controls the current control unit so that an output voltage from the current control unit becomes equal to or lower than a second voltage which is equal to or higher than the first voltage.

12 Claims, 7 Drawing Sheets (56) References Cited

U.S. PATENT DOCUMENTS

| | | | | |
|---|---|---|---|---|
| 7,501,716 | B2* | 3/2009 | Nakajima | G06F 1/26 307/38 |
| 7,782,036 | B1* | 8/2010 | Wong | H02M 3/156 323/282 |
| 8,258,763 | B2* | 9/2012 | Nakamura | H02M 3/156 323/271 |
| 8,737,032 | B2* | 5/2014 | Migliavacca | H03K 17/0822 361/93.9 |
| 8,773,091 | B2* | 7/2014 | Hagan | H02M 3/156 323/271 |
| 9,240,727 | B2* | 1/2016 | Sugawara | H02M 3/33523 |
| 9,647,525 | B2* | 5/2017 | Imai | H02M 1/00 |
| 9,829,900 | B2* | 11/2017 | Suzuki | G05F 1/468 |
| 9,944,218 | B1* | 4/2018 | Park | B60Q 1/0088 |
| 10,386,877 | B1* | 8/2019 | Magen | G05F 1/565 |
| 10,396,660 | B2* | 8/2019 | Fukumoto | H02M 3/155 |
| 10,476,610 | B2* | 11/2019 | Kobayashi | H02M 1/36 |
| 2006/0238944 | A1* | 10/2006 | Yamamoto | G05F 1/575 361/93.1 |
| 2008/0111531 | A1* | 5/2008 | Hasegawa | H02M 3/1588 323/284 |
| 2008/0211313 | A1* | 9/2008 | Nakamura | G05F 1/56 307/75 |
| 2008/0272753 | A1* | 11/2008 | Kawashima | G05F 1/573 323/277 |
| 2009/0103335 | A1* | 4/2009 | Nakamura | H02M 1/32 363/21.17 |
| 2009/0103338 | A1* | 4/2009 | Nakamura | H02M 1/32 363/89 |
| 2009/0184748 | A1* | 7/2009 | Suzuki | G05F 1/569 327/513 |
| 2009/0206807 | A1* | 8/2009 | Imura | G05F 1/573 323/277 |
| 2009/0322302 | A1* | 12/2009 | Fukushi | H02M 1/32 323/284 |
| 2011/0254527 | A1* | 10/2011 | Saito | G05F 1/56 323/284 |
| 2014/0359332 | A1 | 12/2014 | Todeschini et al. | |
| 2015/0066228 | A1* | 3/2015 | Clifton | H02J 3/382 700/295 |
| 2015/0263507 | A1* | 9/2015 | Endo | G05F 1/567 361/18 |
| 2016/0111236 | A1* | 4/2016 | Jin | G05F 1/569 323/276 |
| 2016/0197554 | A1* | 7/2016 | Sakurai | G05F 1/56 323/271 |
| 2016/0211751 | A1* | 7/2016 | Kurozo | G05F 1/569 |
| 2017/0141576 | A1* | 5/2017 | Gutenmann | H02J 3/383 |

OTHER PUBLICATIONS

USB-IF, "Battery Charging Specification, Rev 1.2", Dec. 7, 2010, pp. 1 to 60.

Dec. 4, 2018, International Preliminary Report on Patentability issued in the International Patent Application No. PCT/JP2017/019958.

Apr. 29, 2020, the Extended European Search Report issued by the European Patent Office in the corresponding European Patent Application No. 17806622.1.

Jim Keith, "6V Solar Charge Controller Circuit", Sep. 19, 2012, XP055687194, Retrieved from the Internet: URL: https://www.electroschematics.com/6v-ldo-solar-charge-control-circuit/ [retrieved on Apr. 20, 2020].

Jim Keith, "A Primer on Solar Charge Controls", Aug. 4, 2014, XP055687187, Retrieved from the Internet: URL: https://www.electroschematics.com/primer-solar-charge-controls/ [retrieved on Apr. 20, 2020].

* cited by examiner

ENERGY HARVESTING APPARATUS AND CURRENT CONTROL CIRCUIT

TECHNICAL FIELD

The present disclosure relates to an energy harvesting apparatus and a current control circuit.

BACKGROUND

Recently, there are growing demands for energy harvesting apparatus that generate power corresponding to the external environment in order to allow users to use portable devices such as smartphones, laptop personal computers (PCs), tablet PCs and other external devices even while they are on the go and do not have access to commercial power sources. Such energy harvesting apparatus include those having solar cells that generate power using solar energy, and those that generate power using geothermal energy.

The output power and output voltage of the power generated by such energy harvesting apparatus varies depending on the external environment. When an external device is connected to the energy harvesting apparatus via an interface conforming to a certain standard such as universal serial bus (USB), however, there is a problem of power delivery failure when the output voltage becomes less than a certain level.

One of known energy harvesting apparatus that counter such a problem has a feedback circuit connected to solar cells, wherein the feedback circuit monitors the voltage of the solar cells so that the solar cells are controlled to provide constant output voltage (see, e.g., PTL 1).

CITATION LIST

Patent Literature

PTL: JP2009017686A

SUMMARY

Technical Problem

The apparatus disclosed in PTL 1 reduces the risk of failing to deliver power to an external device because it is possible to control the output voltage to have a constant level. Meanwhile, when no external device is connected to an energy harvesting apparatus or when the connected external device rejects power delivery for some reason (e.g., when a secondary battery is used as an external device and is fully charged), power may be not delivered to the external device. In such a case, in the apparatus disclosed in PTL 1, an open-circuit voltage is generated due to lack of current flow and there is concern that a voltage exceeding an allowable range will be applied to an external device later or already connected to the apparatus.

An object of the present disclosure is therefore to provide an energy harvesting apparatus and a current control circuit which are capable of solving the problem described above and controlling, within a fixed range, a voltage to be applied to an external device.

Solution to Problem

The present disclosure is aimed at advantageously solving the problem described above and an energy harvesting apparatus of the present disclosure is an energy harvesting apparatus for delivering power to a detachable external device, the apparatus including: an energy harvesting unit that generates power corresponding to an external environment; a current control unit connected to the energy harvesting unit; a first voltage control unit that controls the current control unit so that an input voltage to the current control unit becomes equal to or higher than a first voltage; and a second voltage control unit that controls the current control unit so that an output voltage from the current control unit becomes equal to or lower than a second voltage which is equal to or higher than the first voltage, regardless of whether or not the external device is connected. With such a configuration, it is possible to control, within a fixed range, a voltage to be applied to an external device.

It is preferred in the energy harvesting apparatus of the present disclosure that the first voltage control unit includes a first difference detection unit that detects a first difference which is a difference between the input voltage to the current control unit and the first voltage and outputs a value corresponding to the first difference to the current control unit, and the current control unit decreases the first difference by controlling a current.

It is also preferred in the energy harvesting apparatus of the present disclosure that the current control unit decreases a current when the first difference is a difference indicating that the input voltage to the current control unit is lower than the first voltage.

It is also preferred in the energy harvesting apparatus of the present disclosure that the second voltage control unit controls, when the output voltage from the current control unit exceeds the second voltage, a current from the current control unit to control the output voltage so that the output voltage becomes equal to or lower than the second voltage.

It is also preferred in the energy harvesting apparatus of the present disclosure that the second voltage control unit includes: a current-voltage conversion unit that converts a current from the current control unit into a voltage; and a second difference detection unit that detects a second difference which is a difference between the converted voltage and a third voltage and outputs a value corresponding to the second difference to the current control unit, wherein the current control unit decreases the second difference by controlling a current, and the third voltage is a voltage at which the output voltage from the current control unit becomes equal to the second voltage when the voltage becomes equal to the converted voltage.

It is also preferred in the energy harvesting apparatus of the present disclosure that the current control unit decreases a current when the second difference is a difference indicating that the converted voltage exceeds the third voltage.

It is also preferred in the energy harvesting apparatus of the present disclosure that the energy harvesting unit includes a photoelectric conversion module.

It is also preferred in the energy harvesting apparatus of the present disclosure that the photoelectric conversion module is a solar cell module having a thin panel shape and the solar cell module includes a solar cell group in which a plurality of solar cells are electrically connected in series such that an open-circuit voltage across terminals is 5.3 V or more in a usual use mode.

It is also preferred in the energy harvesting apparatus of the present disclosure that the current control unit includes a transistor or an FET.

It is also preferred in the energy harvesting apparatus of the present disclosure that the second voltage control unit includes a Zener diode and a resistor connected in series.

The present disclosure is aimed at advantageously solving the problem described above and an energy harvesting apparatus of the present disclosure includes: an energy harvesting unit that generates power corresponding to an external environment; a current control unit connected to the energy harvesting unit; a first voltage control unit that controls the current control unit so that an input voltage to the current control unit becomes equal to or higher than a first voltage; and a second voltage control unit that controls the current control unit so that an output voltage from the current control unit becomes equal to or lower than a second voltage which is equal to or higher than the first voltage, wherein the first voltage control unit includes a first difference detection unit that detects a first difference which is a difference between the input voltage to the current control unit and the first voltage and outputs a value corresponding to the first difference to the current control unit, the second voltage control unit includes a current-voltage conversion unit that converts a current from the current control unit into a voltage, and a second difference detection unit that detects a second difference which is a difference between the converted voltage and a third voltage and outputs a value corresponding to the second difference to the current control unit, the current control unit decreases the first difference and the second difference by controlling a current, the third voltage is a voltage at which the output voltage from the current control unit becomes equal to the second voltage when the voltage becomes equal to the converted voltage, and the first difference detection unit and the second difference detection unit are constituted of a common differential amplifier. With such a configuration, it is possible to control, within a fixed range, a voltage to be applied to an external device and to commonly use a part of the circuit.

The present disclosure is aimed at advantageously solving the problem described above and a current control circuit of the present disclosure includes: a current control unit connectable to an energy harvesting unit; a first voltage control unit that controls the current control unit so that an input voltage to the current control unit becomes equal to or higher than a first voltage; and a second voltage control unit that controls the current control unit so that an output voltage from the current control unit becomes equal to or lower than a second voltage which is equal to or higher than the first voltage. With such a configuration, it is possible to control, within a fixed range, a voltage to be applied to an external device.

Advantageous Effect

According to the present disclosure, it is possible to provide an energy harvesting apparatus and a current control circuit which are capable of controlling, within a fixed range, a voltage to be applied to an external device.

BRIEF DESCRIPTION OF THE DRAWINGS

In the accompanying drawings.

DETAILED DESCRIPTION

Figure 1:
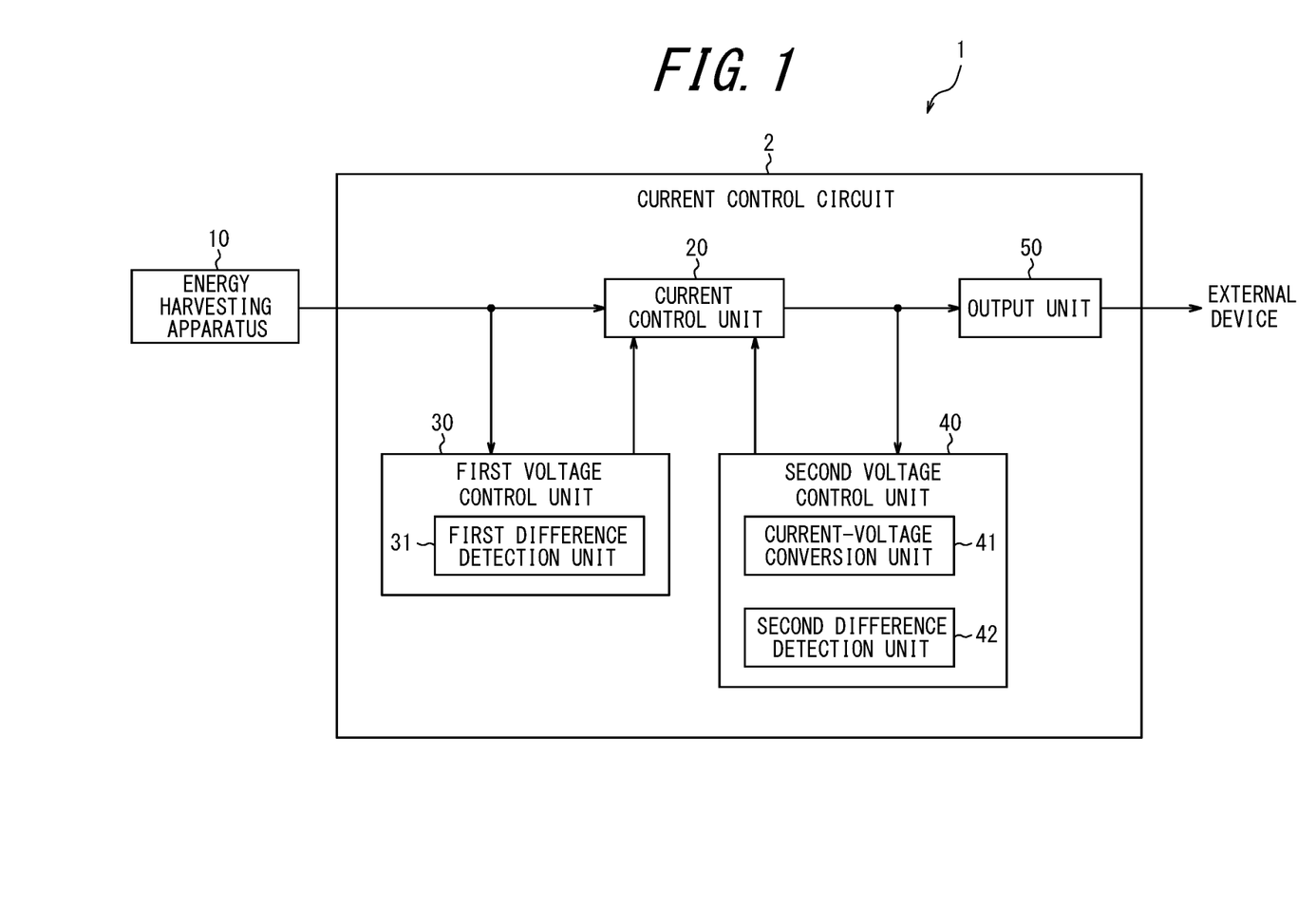
FIG. 1 is a block diagram showing a schematic configuration of an energy harvesting apparatus according to an embodiment of the present disclosure.

Embodiments of the present disclosure will now be described with reference to the accompanying drawings. FIG. 1 is a block diagram showing a schematic configuration of an energy harvesting apparatus 1 according to an embodiment of the present disclosure.

As shown in FIG. 1, the energy harvesting apparatus 1 according to the present embodiment includes an energy harvesting unit 10, a current control unit 20, a first voltage control unit 30, a second voltage control unit 40, and an output unit 50. The current control unit 20, the first voltage control unit 30, the second voltage control unit 40 and the output unit 50 constitute a current control circuit 2.

The energy harvesting unit 10 is connected to the current control unit 20 and generates power according to the external environment. That is, the power generated by the energy harvesting unit 10 varies depending on the external environment. The energy harvesting unit 10 may be configured to be detachably connected to the current control circuit 2.

The current control unit 20 is a device to be connected to the energy harvesting unit 10 and controls a current that flows through the current control unit 20. The current control unit 20 is constituted of a transistor, an FET or the like, for example. Upon receipt of a difference from a first difference detection unit 31 or a second difference detection unit 42 which will be described later, the current control unit 20 controls a current so as to decrease the input difference. The current control unit 20 can be connected to the energy harvesting unit 10 when the energy harvesting unit 10 is configured to be detachably connected to the current control circuit 2.

The first voltage control unit 30 is a device that acquires an input voltage to the current control unit 20 and controls the current control unit 20 so that the input voltage to the current control unit 20 becomes equal to or higher than a first voltage. The "first voltage" is a certain constant voltage, and when the output unit 50 conforms to a certain power delivery standard, it is preferably a lower limit voltage specified by that standard or a voltage that is higher than the lower limit voltage. For example, when the output unit 50 conforms to the USB power delivery standard, the lower limit voltage is 4.75 V (see Battery Charging Specification, Rev 1.2 (Dec. 7, 2010) P43 Table 5-1 Voltages "Charging Port Output Voltage" (BC Standard)), and the first voltage is preferably 4.75 V to 5 V. The first voltage control unit 30 includes a first difference detection unit 31. The first difference detection unit 31 is a device that detects a difference between the input voltage to the current control unit 20 and the first voltage (hereinafter referred to as a "first difference" where appropriate) and outputs a value corresponding to the first difference to the current control unit 20.

The second voltage control unit 40 is a device that acquires an output voltage from the current control unit 20 and, when the output voltage from the current control unit 20 exceeds a second voltage, controls the output voltage from the current control unit 20 so that it becomes equal to or lower than the second voltage by flowing the current from the current control unit 20. The "second voltage" is a certain constant voltage that is equal to or higher than the first voltage, and when the output unit 50 conforms to a certain power delivery standard, it is preferably an upper limit voltage specified by that standard or a voltage that is lower than the upper limit voltage. For example, when the output unit 50 conforms to the USB power delivery standard, the upper limit voltage is 5.25 V (see the BC Standard. Id.) and the second voltage is preferably 5 V to 5.25 V.

The second voltage control unit 40 includes a current-voltage conversion unit 41 and a second difference detection unit 42. The current-voltage conversion unit 41 is a device that converts a current from the current control unit 20 into a voltage. The current before conversion by the current-voltage conversion unit 41 and the voltage after conversion are in a proportional relationship. The second difference detection unit 42 is a device that detects a difference between the voltage converted by the current-voltage conversion unit 41 and a third voltage (hereinafter referred to as a "second difference" where appropriate) and outputs a value corresponding to the second difference to the current control unit 20. The "third voltage" is a voltage at which the output voltage from the current control unit 20 becomes equal to the second voltage when the third voltage becomes equal to the voltage converted by the current-voltage conversion unit 41.

The output unit 50 is an interface such as an output terminal, connected to the current control unit 20 and delivers power to an external device. The output unit 50 preferably conforms to a predetermined power delivery standard, e.g., the USB power delivery standard. Examples of external devices to which the output unit 50 delivers power include portable devices such as smartphones, laptop PCs and tablet PCs, and rechargeable secondary batteries such as lead storage batteries and lithium ion batteries. The output unit 50 is detachably connected to such an external device and delivers power to the external device for example upon receipt of a power delivery request from the external device.

Figure 2:
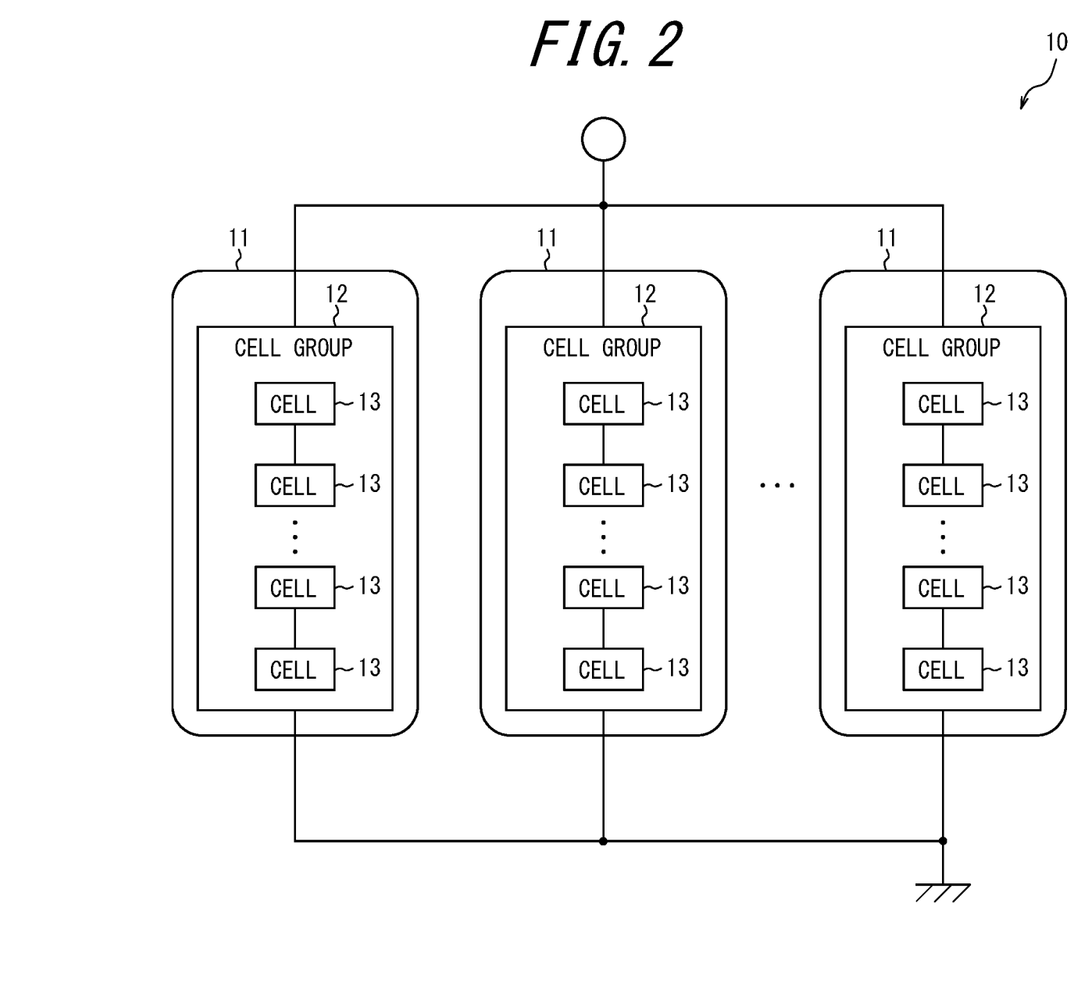
FIG. 2 is a diagram showing a configuration example of an energy harvesting unit according to an embodiment of the present disclosure.

FIG. 2 is a diagram showing an example of a configuration of an energy harvesting unit 10. As shown in FIG. 2, the energy harvesting unit 10 includes, for example, a solar cell module 11 as a photoelectric conversion module. Although FIG. 2 shows three solar cell modules 11, one or two solar cell modules 11 may be used, or four or more solar cell modules 11 may be used. The solar cell module 11 has a thin panel shape and includes a solar cell group 12 in which a plurality of solar cells 13 are electrically connected in series. The solar cell 13 is a member composed of a solar cell that outputs power by photoelectrically converting incident light such as sunlight, room light or the like. The solar cell modules 11 may be coupled together via connecting portions and may be foldable about the connecting portions, for example.

Solar cells constituting the solar cells 13 are roughly classified into inorganic solar cells using inorganic materials and organic solar cells using organic materials. Examples of inorganic solar cells include Si type using silicon (Si) and compound type using compounds. Organic solar cells include thin-film type such as low-molecular weight vapor deposition type using organic pigments, polymer coating type using conductive polymers, and coating conversion type using conversion type semiconductors; and dye sensitized type composed of titania, organic dye, and electrolyte. Solar cells constituting the solar cells 13 can also include organic/inorganic hybrid solar cells and Perovskite compound-based solar cells. In the present disclosure, solar cells 13 having a thin panel shape are used, with dye sensitized solar cells fabricated on a plastic film or the like being suitable. The solar cells 13 are not limited to those fabricated on a plastic film or the like. As a matter of course, the solar cells 13 may be of any mode as long as they are thin.

The solar cell group 12 is formed by connecting in series a number of solar cells 13 sufficient to set the open-circuit voltage across terminals to 5.3 V or more in a usual use mode. Usual use mode herein refers to outdoor use in daytime under weather conditions not extremely bad, where no partial shadows appear on the solar cell group 12. Although FIG. 2 shows an example in which each solar cell module 11 includes one solar cell group 12, each solar cell module 11 may include a plurality of solar cell groups 12. When the solar cell module 11 includes a plurality of solar cell groups 12, the plurality of solar cell groups 12 are disposed such that they are electrically connected in parallel. When the energy harvesting unit 10 includes a plurality of solar cell modules 11, the solar cell groups 12 included in each solar cell module 11 are disposed such that they are electrically connected in parallel. That is, the solar cell groups 12 are electrically connected in parallel.

Figure 3:
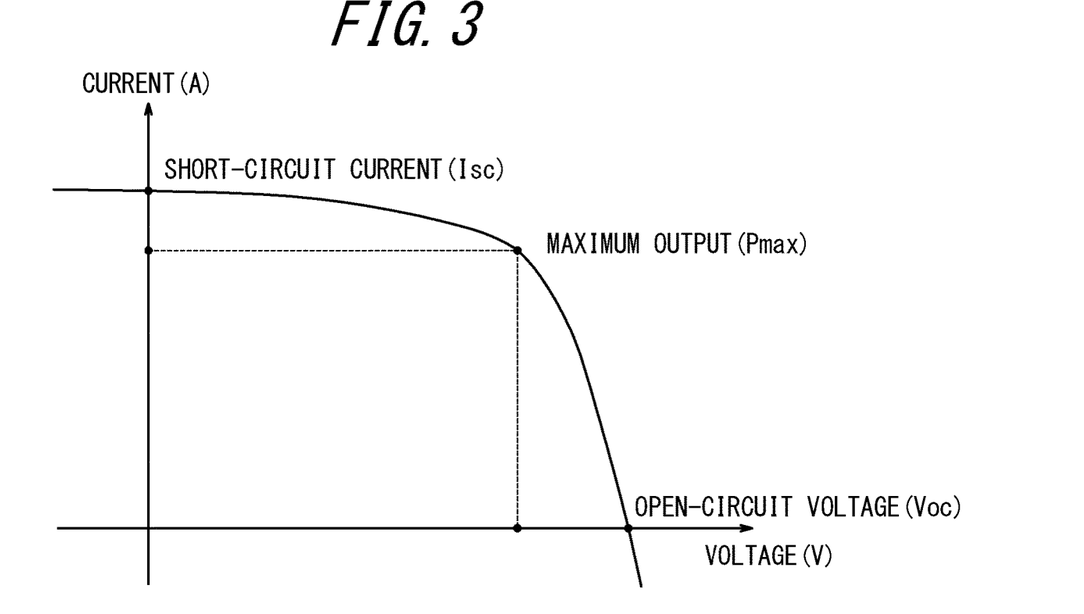
FIG. 3 is a diagram showing current-voltage characteristics of power generated by an energy harvesting unit according to an embodiment of the present disclosure.

FIG. 3 is a diagram showing current-voltage characteristics of power generated by the energy harvesting unit 10. Short-circuit current $I_{sc}$ is a current when the energy harvesting unit 10 is in a short-circuit state, i.e., when the voltage is zero, and takes a maximum current value. Open circuit voltage $V_{oc}$ is a voltage when the energy harvesting unit 10 is in an open-circuit state, i.e., when the current is zero, and takes the maximum voltage value. Maximum output $P_{max}$ is a power at the time when the product of current and voltage becomes the maximum and is a value at which the power generated by the energy harvesting unit 10 becomes the maximum.

Figure 4:
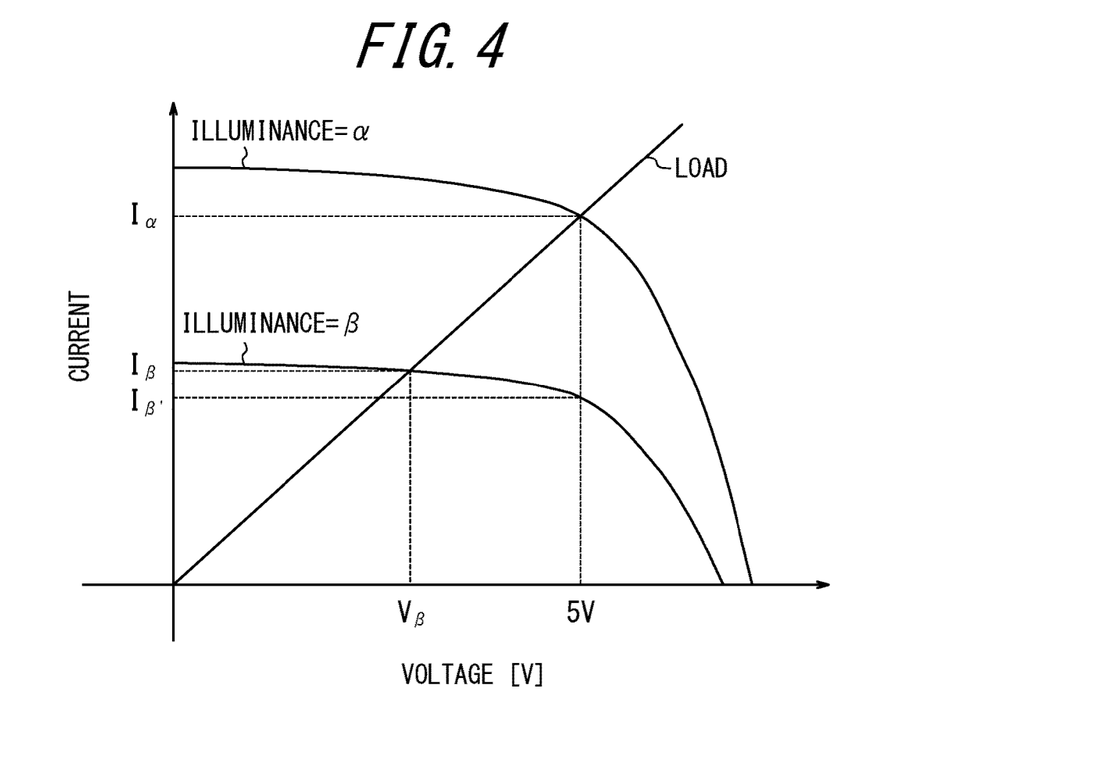
FIG. 4 is a diagram showing a relationship between current and voltage under different illuminance conditions when a predetermined load is connected.

FIG. 4 is a diagram showing a current-voltage relationship of a power generated by the energy harvesting unit 10 under different illuminance conditions when a predetermined load is connected. As shown in FIG. 4, when the illuminance of light incident to the energy harvesting unit 10 is α, the current when a predetermined load is connected as an external device is Iα and the voltage is 5 V. On the other hand, when the illuminance of light incident to the energy harvesting unit 10 is β which is lower than α, the current when a predetermined load is connected is Iβ which is lower than Iα and the voltage is Vβ which is lower than 5 V.

Figure 5:
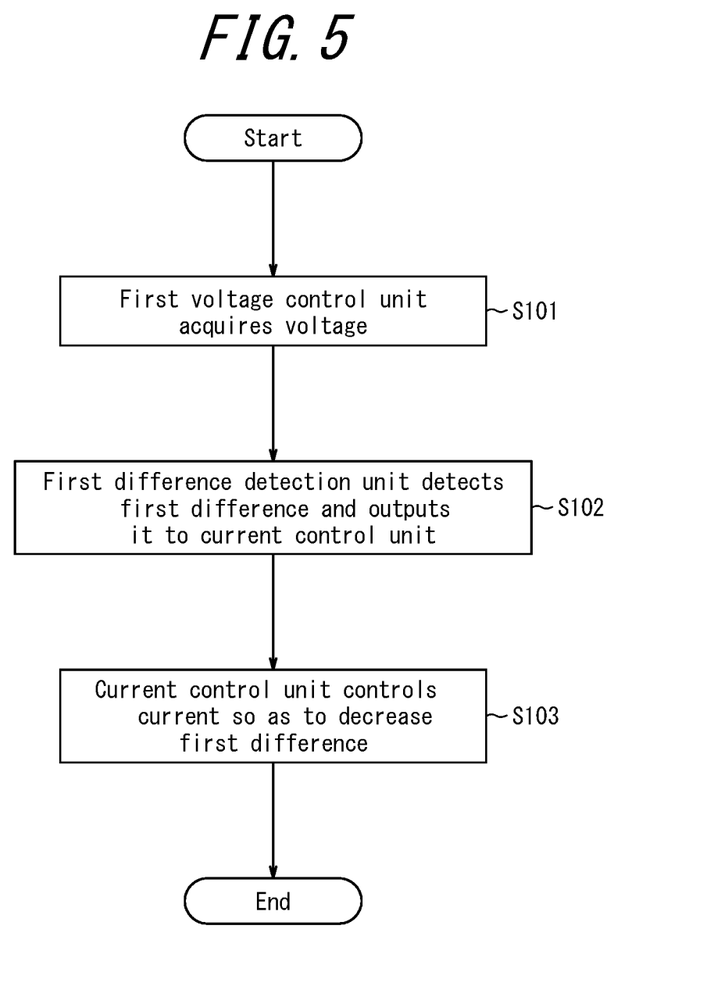
FIG. 5 is a flowchart showing first current control executed by an energy harvesting apparatus according to an embodiment of the present disclosure.

First current control executed by the energy harvesting apparatus 1 according to the present embodiment will be described with reference to the flowchart shown in FIG. 5.

Upon acquiring the input voltage to the current control unit 20 (step S101), the first voltage control unit 30 causes the first difference detection unit 31 to detect a difference between the input voltage to the current control unit 20 and the first voltage (first difference) and outputs a value corresponding to the first difference to the current control unit 20 (step S102). Upon receipt of the value corresponding to the first difference, the current control unit 20 controls a current so as to decrease the first difference (step S103).

The processing of step S103 will be described in detail. It is assumed here that the first voltage is 5 V and a predetermined load shown in FIG. 4 is connected as an external device. At this time, when the input voltage is 5 V (illuminance is α), the first difference is zero. Thus, the current control unit 20 does not change the current Iα corresponding to the input voltage 5 V as it is. On the other hand, when the input voltage is Vβ which is lower than 5 V (illuminance is β), the first difference is a difference indicating that the input voltage is lower than the first voltage 5 V. In order to decrease the first difference, the current control unit 20 decreases the current along the current-voltage characteristics curve shown in FIG. 4 for the illuminance β. That is, the current control unit 20 decreases the current to a current Iβ' at which the input voltage becomes 5 V which is equal to the first voltage.

Thus, according to the energy harvesting apparatus 1, even when high power cannot be obtained by the energy harvesting unit 10, it is possible to deliver power to an external device by increasing the voltage to a predetermined level by decreasing a current.

Figure 6:
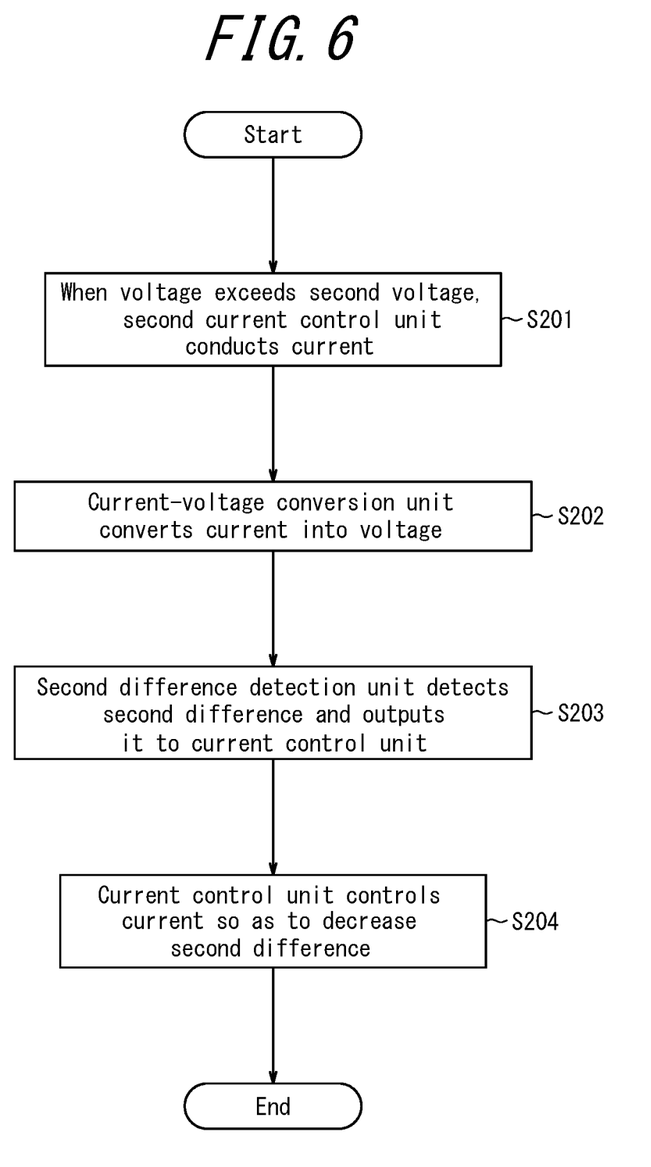
FIG. 6 is a flowchart showing second current control executed by an energy harvesting apparatus according to an embodiment of the present disclosure.

Next, second current control executed by the energy harvesting apparatus 1 according to the present embodiment will be described with reference to the flowchart shown in FIG. 6.

When the output voltage from the current control unit 20 exceeds the second voltage, the second voltage control unit 40 conducts a current from the current control unit 20 (step S 201). Next, the current-voltage conversion unit 41 converts the current from the current control unit 20 into a voltage (step S 202). Next, the second difference detection unit 42 detects a difference between the converted voltage and a third voltage (second difference) and outputs a value corresponding to the second difference to the current control unit 20 (step S203). Upon receipt of the second difference, the current control unit 20 controls a current so as to decrease the second difference (step S204).

Thus, according to the energy harvesting apparatus 1, when the output voltage exceeds the second voltage, the output voltage can be decreased to the second voltage or less by controlling a current by the second voltage control unit 40. With this configuration, it is possible to prevent output of high voltage such as open-circuit voltage. Further, by converting the current output from the current control unit 20 into a voltage and decreasing the current so as to lower the converted voltage to the third voltage, it is possible to decrease the current to an extent that the output voltage does not exceed the second voltage. As a result, the current at the time when power is not delivered to the external device can be kept low.

Figure 7:
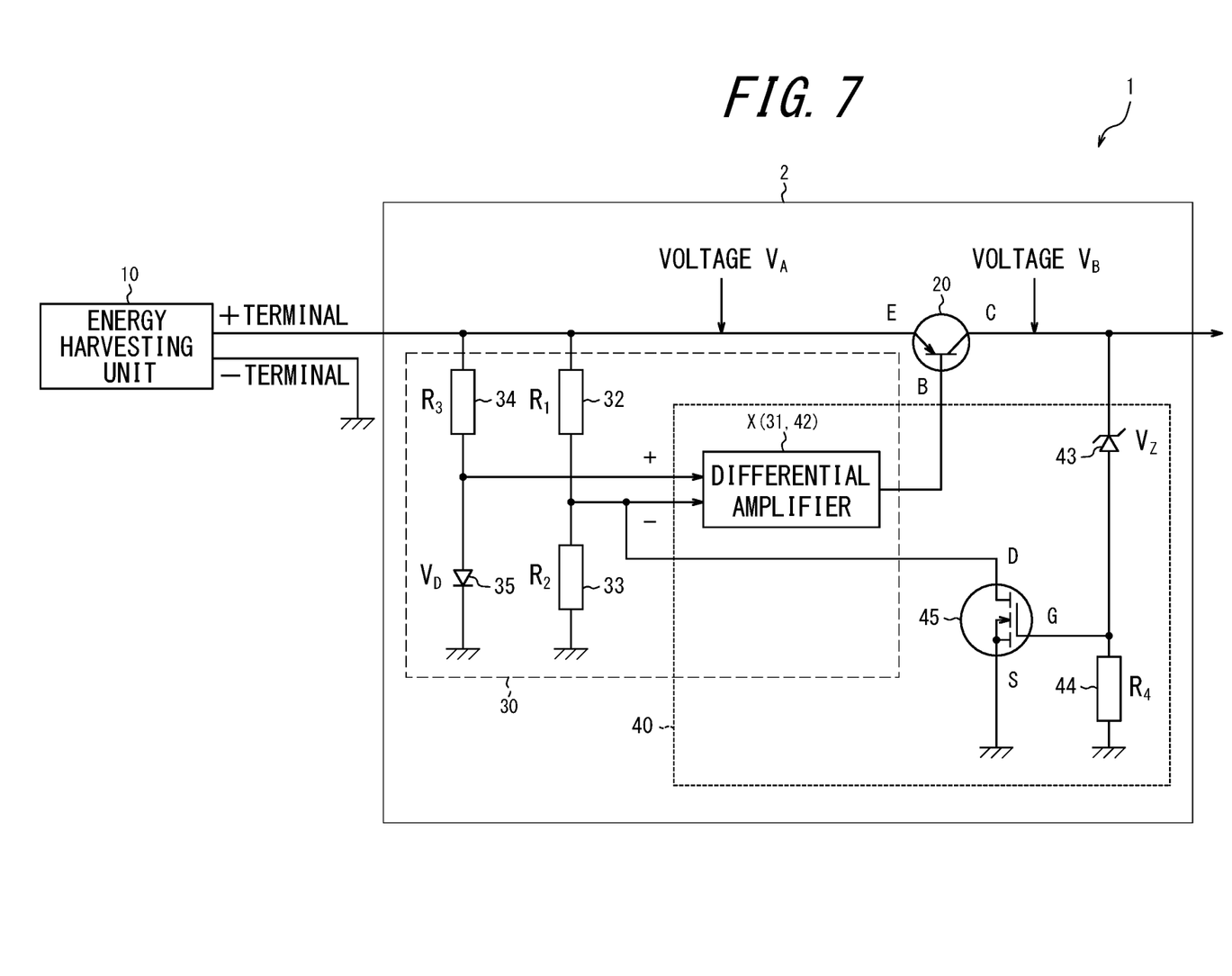
FIG. 7 is a diagram showing a configuration example of a current control circuit according to an embodiment of the present disclosure.

FIG. 7 is a diagram showing a configuration example of the current control circuit 2. In FIG. 7, the output unit 50 is not shown. In the configuration example shown in FIG. 7, the current control unit 20 is constituted of a transistor. The first voltage control unit 30 includes a first resistor 32 having a resistance $R_1$, a grounded second resistor 33 having a resistance $R_2$, a third resistor 34 having a resistance $R_3$, a grounded diode 35 having a drop voltage $V_D$, and a differential amplifier X. The second voltage control unit 40 includes a Zener diode (constant voltage diode) 43 having a Zener voltage $V_Z$, a grounded fourth resistor 44 having a resistance $R_4$, a field effect transistor (FET) 45 whose source (S) is grounded, and a differential amplifier X. The differential amplifier X functions as the first difference detection unit 31 and the second difference detection unit 42 and is constituted for example of an operational amplifier that performs rail-to-rail operation. In other words, the first difference detection unit 31 and the second difference detection unit 42 are constituted of a common differential amplifier X.

First, the operation of the first voltage control unit 30 will be described. Assuming that the input voltage to the current control unit 20 is voltage $V_A$, when the FET 45 is turned off, the voltage $V_-$ input to the negative input terminal of the differential amplifier X through the first resistor 32 becomes $\{R_2/R_1+R_2\}V_A$. The voltage $V_+$ input to the positive input terminal of the differential amplifier X through the third resistor 34 becomes $V_D$. When $V_-$ is lower than $V_+$, the differential amplifier X acts so that $V_-=V_+$ by imaginary short. Thus, because $V_+$ is a fixed value, the differential amplifier X acts on the current control unit 20 such that $V_-$ equals to $V_+$. That is, the current control unit 20 decreases the current of the current control unit 20 until $V_A$ rises to $\{(R_1+R_2)/R_2\}V_D$. $\{(R_1+R_2)/R_2\}V_D$ functions as the first voltage.

Figure 8:
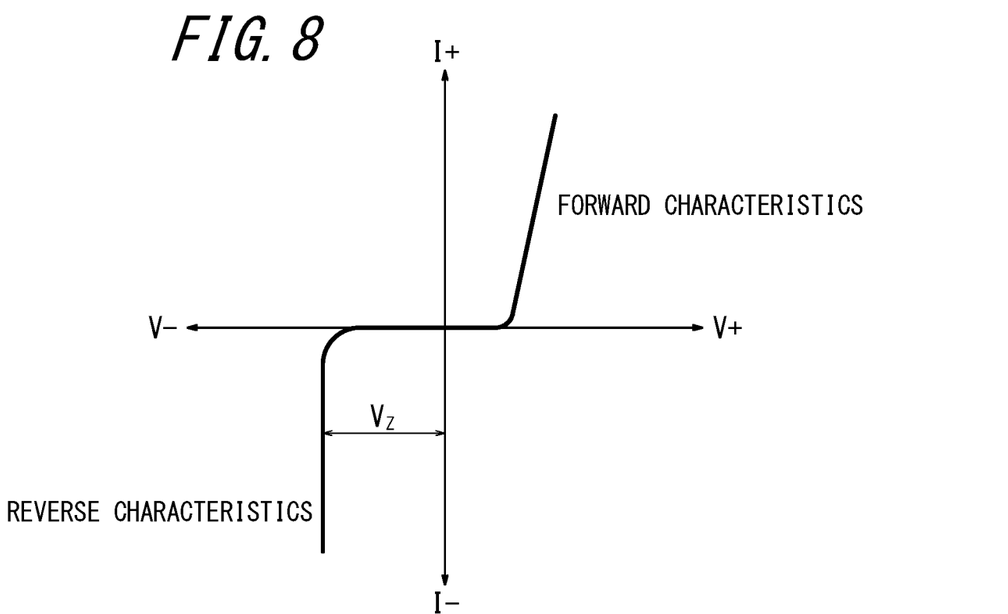
FIG. 8 is a graph showing current-voltage characteristics of a Zener diode.

Next, the operation of the second voltage control unit 40 will be described. A Zener diode 43 is connected in the reverse direction from the output side of the current control unit 20. The Zener diode 43 shows current-voltage characteristics such as those shown in FIG. 8. That is, the Zener diode 43 has a property of passing a current when a constant Zener voltage $V_Z$ is applied in the reverse direction. When the output voltage $V_B$ coming from the current control unit 20 becomes higher than the Zener voltage $V_Z$ of the Zener diode 43, the current $I_B$ from the current control unit 20 flows to the second voltage control unit 40. Because the grounded fourth resistor 44 is connected in series to the Zener diode 43, $V_B$ is equal to the sum of the Zener voltage $V_Z$ and the product of $R_4$ and $I_B$ (i.e., $V_B=V_Z+I_BR_4$).

The voltage input to the gate (G) of the FET 45 is $I_BR_4$, which is proportional to the current $I_B$ which is converted into a voltage. When the voltage $I_BR_4$ input to the gate (G) of the FET 45 exceeds a gate threshold voltage, the FET 45 is turned on, so that the voltage $V_-$ input to the negative input terminal of the differential amplifier X through the first resistor 32 decreases and becomes lower than $V_+$. As the differential amplifier X acts on the current control unit 20 so that $V_-$ becomes equal to $V_+$ in the same manner as described above, the current of the current control unit 20 decreases and $I_B$ decreases as well. When $I_BR_4$ becomes equal to or lower than the gate threshold voltage, the FET 45 is turned off, and the current decrease in the current control unit 20 finishes. The gate threshold voltage of the FET 45 functions as the third voltage.

Specifically, when it is desired to set the second voltage to 5 V, if $V_Z$ at $I_B$=1 μA is 4 V, $R_4$ can be set such that the voltage across the fourth resistor 44 at $I_B$=1 μA is 1 V, resulting in $R_4$=1 MΩ. In this case, the current control unit 20 decreases a current so that $I_B$=1 μA.

Figure 9:
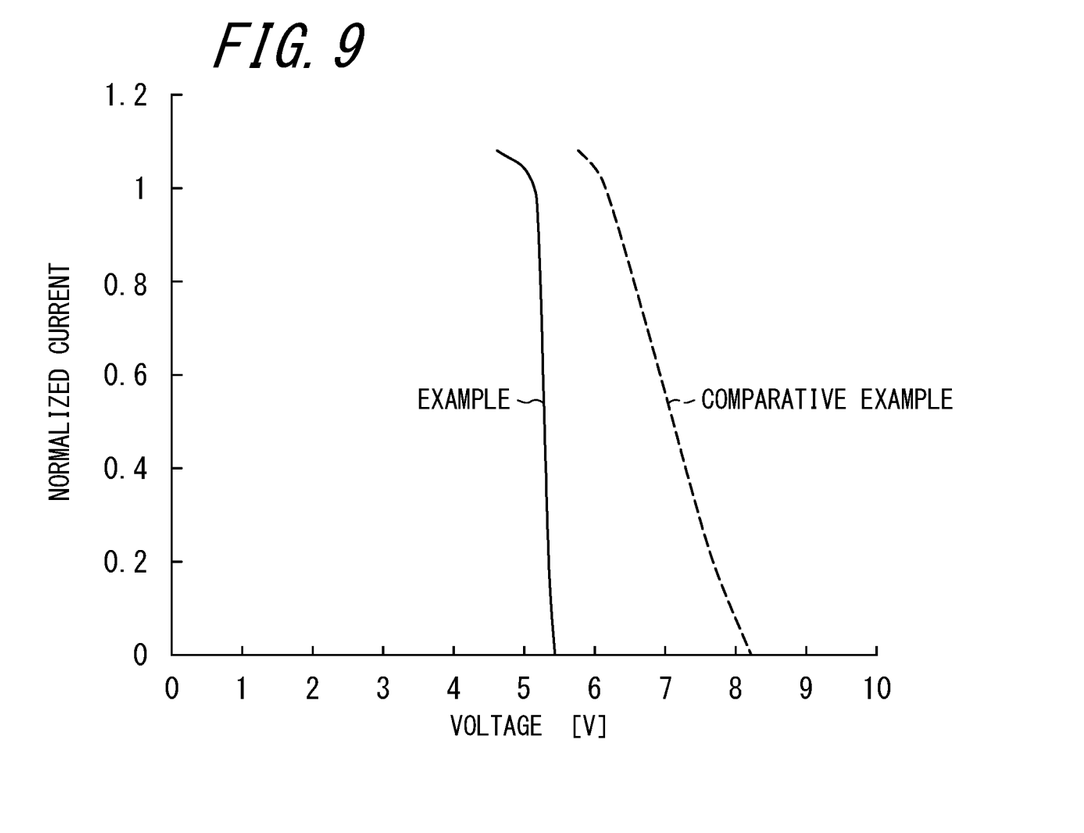
FIG. 9 is a diagram showing a measurement result of current-voltage characteristics obtained by an energy harvesting apparatus according to an embodiment of the present disclosure.

FIG. 9 is a diagram showing a measurement result (Example) of current-voltage characteristics obtained by the energy harvesting apparatus 1. As a comparative example, there is shown a measurement result of a case where power is directly delivered to a load from a power generation apparatus having a configuration corresponding to the energy harvesting unit 10 without using the current control circuit 2 of the present embodiment. As shown in FIG. 9, it is evident that according to the energy harvesting apparatus 1 of the present embodiment, the voltage applied to the external device is controlled to fall within a more fixed range compared to the comparative example.

The foregoing description merely illustrates one embodiment of the present disclosure and it should be appreciated that various alterations and modifications can be made within the scope of the claims.

INDUSTRIAL APPLICABILITY

According to the present disclosure, it is possible to provide an energy harvesting apparatus and a current control circuit which are capable of controlling, within a fixed range, a voltage to be applied to an external device.

REFERENCE SIGNS LIST

1 Energy harvesting apparatus
2 Current control circuit
10 Energy harvesting unit
11 Solar cell module
12 Solar cell group
13 Solar cell
20 Current control unit
30 First voltage control unit
31 First difference detection unit
32 First resistor
33 Second resistor
34 Third resistor
35 Diode
40 Second voltage control unit
41 Current voltage conversion unit
42 Second difference detection unit
43 Zener diode
44 Fourth resistor
45 FET
50 Output unit
X Differential amplifier

The invention claimed is:

1. An energy harvesting apparatus for delivering power to a detachable external device, comprising:
an energy harvesting unit that generates power corresponding to an external environment;
a current control unit connected to the energy harvesting unit;
a first voltage control unit that controls the current control unit so that an input voltage to the current control unit becomes equal to or higher than a first voltage; and
a second voltage control unit that controls the current control unit so that an output voltage from the current control unit becomes equal to or lower than a second voltage which is equal to or higher than the first voltage, regardless of whether or not the external device is connected.

2. The energy harvesting apparatus according to claim 1, wherein the first voltage control unit includes a first difference detection unit that detects a first difference which is a difference between the input voltage to the current control unit and the first voltage and outputs a value corresponding to the first difference to the current control unit, and
the current control unit decreases the first difference by controlling a current.

3. The energy harvesting apparatus according to claim 2, wherein the current control unit decreases a current when the first difference is a difference indicating that the input voltage to the current control unit is lower than the first voltage.

4. The energy harvesting apparatus according to claim 1, wherein the second voltage control unit controls, when the output voltage from the current control unit exceeds the second voltage, a current from the current control unit to control the output voltage so that the output voltage is equal to or lower than the second voltage.

5. The energy harvesting apparatus according to claim 4, wherein the second voltage control unit comprises:
a current-voltage conversion unit that converts a current from the current control unit into a voltage; and
a second difference detection unit that detects a second difference which is a difference between the converted voltage and a third voltage and outputs a value corresponding to the second difference to the current control unit, wherein
the current control unit decreases the second difference by controlling a current, and
the third voltage is a voltage at which the output voltage from the current control unit becomes equal to the second voltage when the third voltage becomes equal to the converted voltage.

6. The energy harvesting apparatus according to claim 5, wherein the current control unit decreases a current when the second difference is a difference indicating that the converted voltage exceeds the third voltage.

7. The energy harvesting apparatus according to claim 1, wherein the energy harvesting unit includes a photoelectric conversion module.

8. The energy harvesting apparatus according to claim 7, wherein the photoelectric conversion module is a solar cell module having a thin panel shape, and
the solar cell module includes a solar cell group in which a plurality of solar cells are electrically connected in series such that an open-circuit voltage across terminals is 5.3 V or more in a usual use mode.

9. The energy harvesting apparatus according to claim 1, wherein the current control unit includes a transistor or an FET.

10. The energy harvesting apparatus according to claim 1, wherein the second voltage control unit includes a Zener diode and a resistor connected in series.

11. An energy harvesting apparatus comprising:
an energy harvesting unit that generates power corresponding to an external environment;
a current control unit connected to the energy harvesting unit;
a first voltage control unit that controls the current control unit so that an input voltage to the current control unit becomes equal to or higher than a first voltage; and
a second voltage control unit that controls the current control unit so that an output voltage from the current control unit becomes equal to or lower than a second voltage which is equal to or higher than the first voltage, wherein
the first voltage control unit includes a first difference detection unit that detects a first difference which is a difference between the input voltage to the current control unit and the first voltage and outputs a value corresponding to the first difference to the current control unit,
the second voltage control unit includes a current-voltage conversion unit that converts a current from the current control unit into a voltage, and a second difference detection unit that detects a second difference which is a difference between the converted voltage and a third voltage and outputs a value corresponding to the second difference to the current control unit,
the current control unit decreases the first difference and the second difference by controlling a current, the third voltage is a voltage at which the output voltage from the current control unit becomes equal to the second voltage when the third voltage becomes equal to the converted voltage, and the first difference detection unit and the second difference detection unit are constituted of a common differential amplifier.

12. A current control circuit comprising:

a current control unit connectable to an energy harvesting unit;

a first voltage control unit that controls the current control unit so that an input voltage to the current control unit becomes equal to or higher than a first voltage; and a second voltage control unit that controls the current control unit so that an output voltage from the current control unit becomes equal to or lower than a second voltage which is equal to or higher than the first voltage.

* * * * *